(12) United States Patent
Fan et al.

(10) Patent No.: US 10,732,577 B2
(45) Date of Patent: Aug. 4, 2020

(54) CAPATICANCE-TO-DIGITAL CONVERTER

(71) Applicant: NXP B.V., Eindhoven (NL)

(72) Inventors: Hao Fan, Eindhoven (NL); Michiel Pertijs, Delft (NL); Berry Anthony Johannus Buter, Veldhoven (NL)

(73) Assignee: NXP B.V., San Jose, CA (US)

( * ) Notice: Subject to any disclaimer, the term of this patent is extended or adjusted under 35 U.S.C. 154(b) by 0 days.

(21) Appl. No.: 16/527,607

(22) Filed: Jul. 31, 2019

(65) Prior Publication Data

US 2020/0073334 A1    Mar. 5, 2020

(30) Foreign Application Priority Data

Aug. 31, 2018    (EP) .................................... 18192120

(51) Int. Cl.
*G04F 10/00* (2006.01)
*H03K 5/24* (2006.01)
*H03K 5/00* (2006.01)

(52) U.S. Cl.
CPC ............ *G04F 10/005* (2013.01); *H03K 5/24* (2013.01); *H03K 2005/00078* (2013.01)

(58) Field of Classification Search
CPC ............ H03M 1/14; H03M 1/54; H03M 1/50; H03M 1/10; H03M 1/145; G04F 10/005
USPC .................................................. 341/155–170
See application file for complete search history.

(56) References Cited

U.S. PATENT DOCUMENTS

| 4,001,813 A | * | 1/1977 | Kosakowski | ............ G01L 9/12 |
| | | | | 341/172 |
| 4,163,221 A | * | 7/1979 | Kosakowski | ........... H03M 1/46 |
| | | | | 341/172 |
| 7,782,243 B1 | * | 8/2010 | Lu | .......................... H03M 3/384 |
| | | | | 341/155 |
| 10,401,409 B2 | * | 9/2019 | Buffa | ..................... H03K 23/50 |
| 2005/0258998 A1 | * | 11/2005 | Confalonieri | ........ G11C 27/024 |
| | | | | 341/172 |
| 2010/0194615 A1 | * | 8/2010 | Lu | .......................... H03M 3/454 |
| | | | | 341/155 |

(Continued)

OTHER PUBLICATIONS

Hao Fan: "A High-Resolution Capacitance-to-Digital Converter based on Iterative Discharging", Oct. 27, 2017, XP55564760, pp. 1-67.

(Continued)

*Primary Examiner* — Lam T Mai

(57) ABSTRACT

A capacitance-to-digital-converter includes a first delay block configured to output a first signal after a first delay based on a voltage at a capacitive sensor, the capacitive sensor configured to be iteratively discharged; a second delay block configured to output a second signal after a second delay; and a capacitance determination unit configured to determine a value indicative of a capacitance sensed by the capacitive sensor. This determination is based on: a number of clock periods during which the first delay is less than a third delay; a first time difference between receipt of the first signal and the second signal during a last clock period during which the first delay is less than the third delay; and a second time difference between receipt of the first signal and receipt of the second signal during a first clock period during which the first delay is greater than the third delay.

15 Claims, 6 Drawing Sheets

(56) References Cited

U.S. PATENT DOCUMENTS

| | | | |
|---|---|---|---|
| 2010/0295709 A1* | 11/2010 | Wu | G01D 5/24 |
| | | | 341/15 |
| 2011/0234528 A1* | 9/2011 | Guedon | G06F 3/0416 |
| | | | 345/174 |
| 2012/0112817 A1* | 5/2012 | Guedon | H03M 3/356 |
| | | | 327/517 |
| 2012/0112947 A1* | 5/2012 | Krauss | H03M 1/60 |
| | | | 341/172 |
| 2015/0029372 A1* | 1/2015 | Lee | H04N 5/347 |
| | | | 348/308 |
| 2015/0295587 A1* | 10/2015 | Garcia Gonzalez | H03M 3/356 |
| | | | 341/121 |
| 2016/0182081 A1* | 6/2016 | Perrott | G01N 27/26 |
| | | | 341/143 |
| 2017/0261459 A1* | 9/2017 | Meyer | G06F 3/03547 |
| 2018/0254779 A1* | 9/2018 | Omran | G01D 5/24 |
| 2018/0337684 A1* | 11/2018 | Rogi | H03M 1/069 |
| 2019/0072597 A1* | 3/2019 | Walsh | G01R 27/2605 |

OTHER PUBLICATIONS

Jung et al.: "27.6 A 0.7 pF-to-10nF fully digital capacitance-to-digital converter using iterative delay-chain discharge", IEEE Int. Solid-State Circuits Conference, ISSCC 2015, Session 27, Physical Sensors, 27.6, Feb. 25, 2015, pp. 484-486.

\* cited by examiner

CAPATICANCE-TO-DIGITAL CONVERTER

CROSS-REFERENCE TO RELATED APPLICATIONS

This application claims the priority under 35 U.S.C. § 119 of European Patent application no. 18192120.6, filed on 31 Aug. 2018, the contents of which are incorporated by reference herein.

The present disclosure relates to a capacitance-to-digital converter and a method of converting a capacitance to a digital signal. More particularly, the present disclosure relates to a capacitance-to-digital converter and method of converting a capacitance to a digital signal with improved resolution.

According to a first aspect of the present disclosure there is provided a capacitance to digital converter comprising:
  a first delay block having an input node configured to receive a voltage from a capacitive sensor and a clock node configured to receive a clock signal defining a clock period until a subsequent clock signal, the first delay block configured to output a first output signal after a first delay time in response to receiving the clock signal each clock period, the first delay time based on the voltage at the input node, and wherein the first delay block is configured to provide for iterative discharging of the capacitive sensor based on the clock signal;
  second delay block having an input node configured to receive a first voltage and a clock node configured to receive the clock signal, the second delay block configured to output a second output signal after a second delay time in response to the clock signal, the second delay time based on the first voltage; and
  a capacitance determination unit configured to determine a value indicative of a capacitance sensed by the capacitive sensor based on:
    the number of clock periods during which the first delay time is less than a third delay time;
    a first time difference between a time of receipt of the first output signal and a time of receipt of the second output signal by the capacitance determination unit during a last clock period during which the first delay time is less than the third delay time; and
    a second time difference between a time of receipt of the first output signal and a time of receipt of the second output signal by the capacitance determination unit during a first clock period during which the first delay time is greater than the third delay time,
  wherein the third delay time comprises a constant delay time after the clock signal and wherein the third delay time is greater than or equal to the second delay time.

In one or more embodiments, the capacitance determination unit may be configured to determine a value indicative of a capacitance wherein, at least prior to a first iterative discharge of the capacitive sensor, the voltage at the capacitive sensor may be higher than the first voltage and correspondingly, the first delay time is shorter than the second or third delay times.

In one or more embodiments, the capacitance determination unit may comprise:
  a control unit, the control unit comprising a counter module configured to count the number of clock periods during which the first delay time is less than the third delay time; and
  a fine measurement unit, the fine measurement unit configured to receive the first and second output signals and the fine measurement unit comprising a time-to-digital converter, wherein the time-to-digital converter is configured to at least measure the first time difference and the second time difference.

In one or more embodiments, the control unit may further comprise a first comparator and a digital control block comprising an edge generator, the first comparator configured to provide an output signal to the digital control block which is configured to cause the edge generator to generate or stop generating the clock signal based on the output signal of the first comparator.

In one or more embodiments, the first comparator may further be configured to provide an output signal to the digital control block which provides a control signal to the edge generator which causes the edge generator to stop the generation of clock signals during a first clock period during which the second output signal was received by the first comparator prior to the first output signal.

In one or more embodiments, the value indicative of a capacitance sensed by the capacitive sensor may be based on:
  the number of clock periods during which the first delay time is less than the third delay time; and
  the first time difference divided by the sum of the first time difference and the second time difference.

In one or more embodiments, the third delay time may be equal to the second delay time and the second delay block thereby provides its second output signal after said third delay time.

In one or more embodiments, the capacitance to digital converter may comprise a trigger delay block configured to provide for activation, from a deactivated state, of the time-to-digital converter to allow for determination of the difference between the time of receipt of the first output signal and the time of receipt of the second output signal:
  a) after at least one clock period; and
  b) before the last clock period during which the first time delay is greater than the third time delay.

In one or more embodiments, the trigger delay block may comprise a third delay block having an input node configured to receive a second voltage higher than the first voltage and a clock node configured to receive the clock signal, the trigger delay block configured to output a third output signal after a fourth delay time in response to the clock signal, the fourth delay time based on the second voltage.

In one or more embodiments, the trigger delay block may comprise the second delay block and the capacitance determination unit may be configured to receive a fourth output signal after the third delay time based on a third voltage, wherein the third delay time is longer than the second delay time and wherein the capacitance-to-digital convertor is configured to operate in:
  a calibration mode, in which the time-to-digital converter is configured to determine a third time difference wherein the third time difference is the difference between a time of receipt of the fourth output signal and a time of receipt of the second output signal; and
  a measurement mode for iterative discharging of the capacitive sensor in which the determination of the value indicative of the capacitance of the capacitive sensor is further based on the third time difference.

In one or more embodiments, the trigger delay block may comprise the second delay block and the capacitance-to-digital converter may further comprise a fourth delay block having an input node configured to receive the third voltage and a clock node configured to receive the clock signal, the fourth delay block configured to output the fourth output signal after the third delay time in response to the clock signal.

In one or more embodiments, the first comparator may further be configured to provide an output to the digital control block which provides a control signal to the edge generator which causes the edge generator to stop the generation of clock signals during a first clock period during which the fourth output signal was received by the first comparator prior to the first output signal.

In one or more embodiments, the first clock period during which the fourth output signal was received by the first comparator prior to the first output signal may be the first clock period during which the first delay time is greater than the third delay time.

In one or more embodiments, the fine measurement unit may comprise a second comparator configured to receive the first output signal and the second output signal and, when the second comparator detects that the first output signal is received after the second output signal, the second comparator may be configured to activate the time-to-digital converter from a deactivated state.

In one or more embodiments, each delay block may comprise a level shifter configured to shift the voltage level of the signal to be output by the delay block to one appropriate for the capacitance determination unit.

In one or more embodiments, the time-to-digital converter may be a ring oscillator type time-to-digital converter.

In one or more embodiments, a first input node of the time-to-digital converter may be switchably configured to receive either the fourth output signal of the fourth delay block or the first output signal of the first delay block and a second input node of the time-to-digital converter may be configured to receive the second output signal of the second delay block and wherein selection of which of the first or fourth delay block may be connected to the first input node of the time-to-digital converter is based on the difference between the time of receipt of the second output signal and the time of receipt of the first output signal by the second comparator.

In one or more embodiments, the switchable connection of the first input node of the time-to-digital converter may be provided by a multiplexer and the switching of the multiplexer may be based on the time of receipt of the first output signal and the second output signal by the second comparator.

In one or more embodiments, the first input node of the time-to-digital converter may be configured to receive the fourth output signal when the first output signal is received by the second comparator prior to the second output signal and the first input node of the time-to-digital converter may be configured to receive the second output signal when the first output signal is received by the second comparator after the second output signal.

In one or more embodiments, the input node of the first delay block may be switchably connected between the capacitive sensor and a reference voltage node, the reference voltage node configured to, when connected to the first delay block in the calibration mode, provide the third voltage to the first delay block such that the first delay block is configured to output the fourth output signal after the third delay time after receipt of the clock signal and wherein, in the measurement mode, the input node of the first delay block is connected to the capacitive sensor.

In one or more embodiments, multiple measurements of the third time difference may be recorded and an average third time difference may be used for subsequent calculations.

In one or more embodiments, the control signal of the digital control block may be based on the time of receipt of the first output signal by the first comparator, the time of receipt of the second output signal by the first comparator and the third time difference.

In one or more embodiments, the digital control block may be configured to provide an output signal to the edge generator to stop the generation of clock signals when both:
 a) the first output signal is received after to the second output signal; and
 b) when the time difference between receipt of the first output signal and the second output signal is greater than the third time difference.

In one or more embodiments, the digital control block may store the third time difference for determination of the value indicative of the capacitance of the capacitive sensor one or more of: in the digital control block; on a local memory device; and on a memory device external to the capacitance-to-digital converter.

In one or more embodiments, the capacitance determination unit may comprise a second comparator configured to receive, during the measurement mode, the first output signal and the second output signal and, when the second comparator detects that the first output signal is received after the second output signal, the second comparator may be configured provide an output signal configured to activate the time-to-digital converter.

In one or more embodiments, the second comparator may be the same comparator as the first comparator. In one or more embodiments, the first comparator and the second comparator may not be the same comparator.

In one or more embodiments, the time of receipt of the first output signal and the time of receipt of the second output signal may be defined by the time of receipt of the leading edge of the corresponding signal by the receiving device. In one or more embodiments, the time of receipt of the first output signal and the time of receipt of the second output signal may be defined by the time of receipt of the trailing edge of the corresponding signal by the receiving device. In one or more embodiments, the leading edge may be a rising edge or a falling edge of the clock signal.

In one or more embodiments, the value indicative of the capacitance of the capacitive sensor may be based on:
 the sum of the number of clock periods during which the first delay time was less than the third delay time; and
 the third time difference minus the first time difference, the result divided by the sum of the first time difference and the second time difference.

In one or more embodiments, the value indicative of the capacitance sensed by the capacitive sensor may be the sum of:
 the number of clock periods during which the first delay time was less than the third delay time; and
 the third time difference minus the first time difference, the result divided by the sum of the first time difference and the second time difference.

According to a second aspect of the present disclosure, there is provided a method of providing capacitance to digital conversion of a capacitance sensed by a capacitive sensor comprising:
 receiving a voltage at a capacitive sensor;
 iteratively discharging the capacitive sensor through a first delay block based on a clock signal, the clock signal defining a clock period until a subsequent clock signal, the first delay block having an input node configured to receive the voltage from the capacitive sensor and a clock node configured to receive the clock signal, the first delay block configured to output a first output signal based on the voltage at the input node;

providing a second output signal after a second delay time from a second delay block in response to the clock signal, the second input node configured to receive a first voltage and a clock node configured to receive the clock signal, wherein the second delay time is based on a first voltage; and determining a value indicative of a capacitance sensed by the capacitive sensor based on:

the number of clock periods during which the first delay time is greater than a third delay time;

a first time difference between a time of receipt of the first output signal and the second output signal by the capacitance determination unit during a last clock period during which the first delay time is less than the third delay time; and a second time difference between a time of receipt of the first output signal and the second output signal by the capacitance determination unit during a first clock period during which the first delay time is greater than the third delay time, wherein the third delay time comprises a constant delay time after the clock signal and wherein the third delay time is greater than or equal to the second delay time.

While the disclosure is amenable to various modifications and alternative forms, specifics thereof have been shown by way of example in the drawings and will be described in detail. It should be understood, however, that other embodiments, beyond the particular embodiments described, are possible as well. All modifications, equivalents, and alternative embodiments falling within the spirit and scope of the appended claims are covered as well.

The above discussion is not intended to represent every example embodiment or every implementation within the scope of the current or future Claim sets. The figures and Detailed Description that follow also exemplify various example embodiments. Various example embodiments may be more completely understood in consideration of the following Detailed Description in connection with the accompanying Drawings.

One or more embodiments will now be described by way of example only with reference to the accompanying drawings in which.

Figure 10:
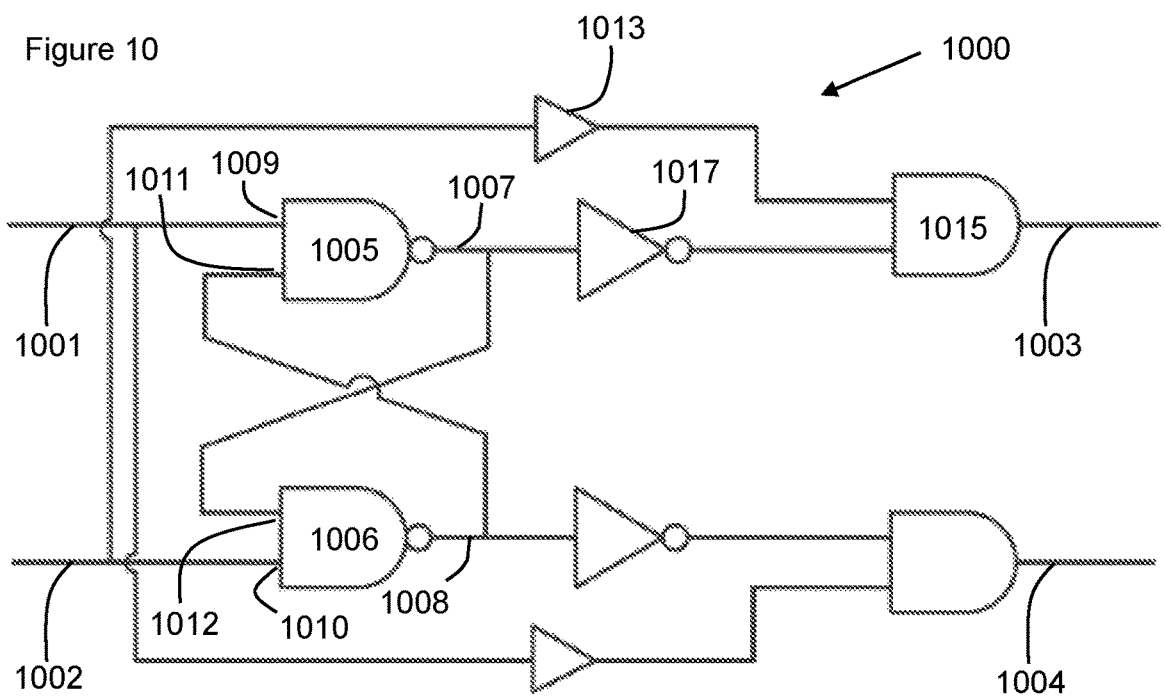
Figure 11:
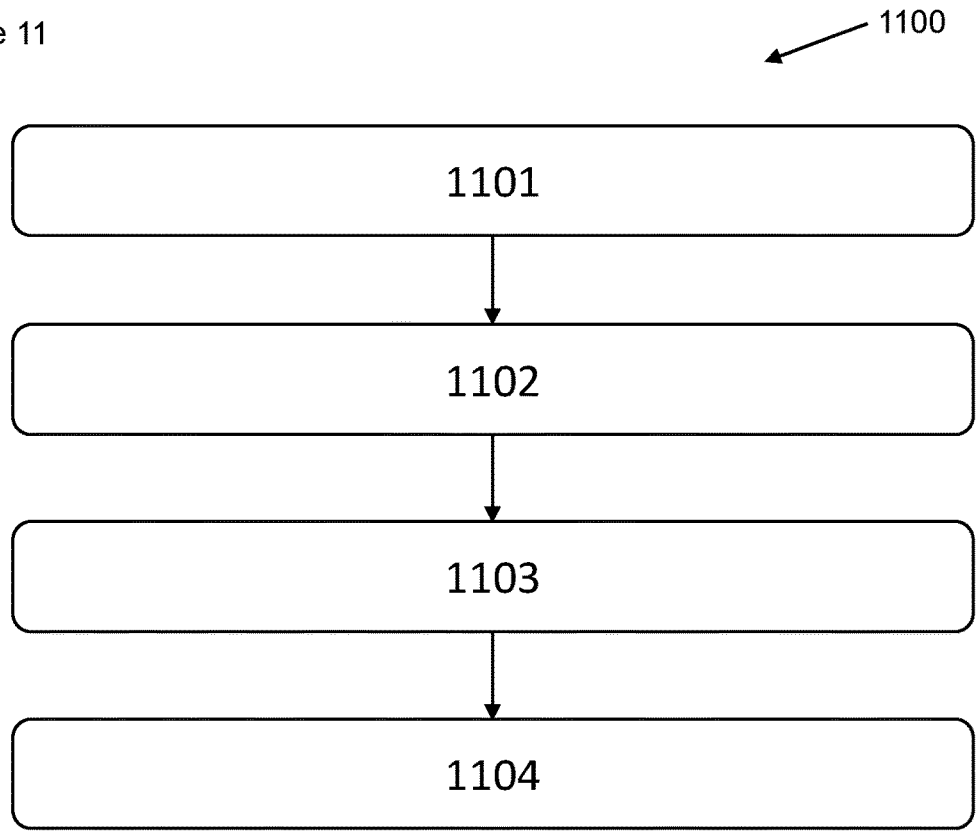

FIGS. 9A-D show example alternatives for the inverter delay block;

FIG. 10 shows an example implementation of a delay comparator implemented with logic gates; and FIG. 11 shows an example method for providing capacitance-to-digital conversion of a capacitance sensed by a capacitive sensor.

The accurate measurement of capacitance values is an important factor in a range of applications, such as capacitive pressure sensors, touch sensors, fluid level detectors and relative humidity sensors. Most capacitance-to-digital converters use analog/mixed-signal circuits as a solution, which may occupy a large area and are not easily migrated to new technologies. An iterative discharge capacitance-to-digital converter (CDC) provides an appropriate fully digital solution. The various embodiments described herein provide for improvements to one or more features of an iterative discharge capacitance-to-digital converter.

In one or more embodiments, a measurement of a capacitance sensed by a capacitive sensor may be provided with improved resolution over conventional methods by a measurement of a number of clock periods over which the voltage stored on a capacitive sensor is iteratively discharged to a predetermined level and also interpolating time differences between signals received over clock periods at the time the predetermined level is reached. In a first embodiment, a measurement of a capacitance sensed by a capacitive sensor may be provided by using a counter to determine a number of clock periods over which the voltage stored on a capacitive sensor is discharged and also using a time-to-digital converter (TDC) in order to interpolate between two coarse conversion steps. It will be appreciated that a capacitive sensor may comprise, at least in part, a capacitor or any other component or device capable of storing a charge.

Figure 1:
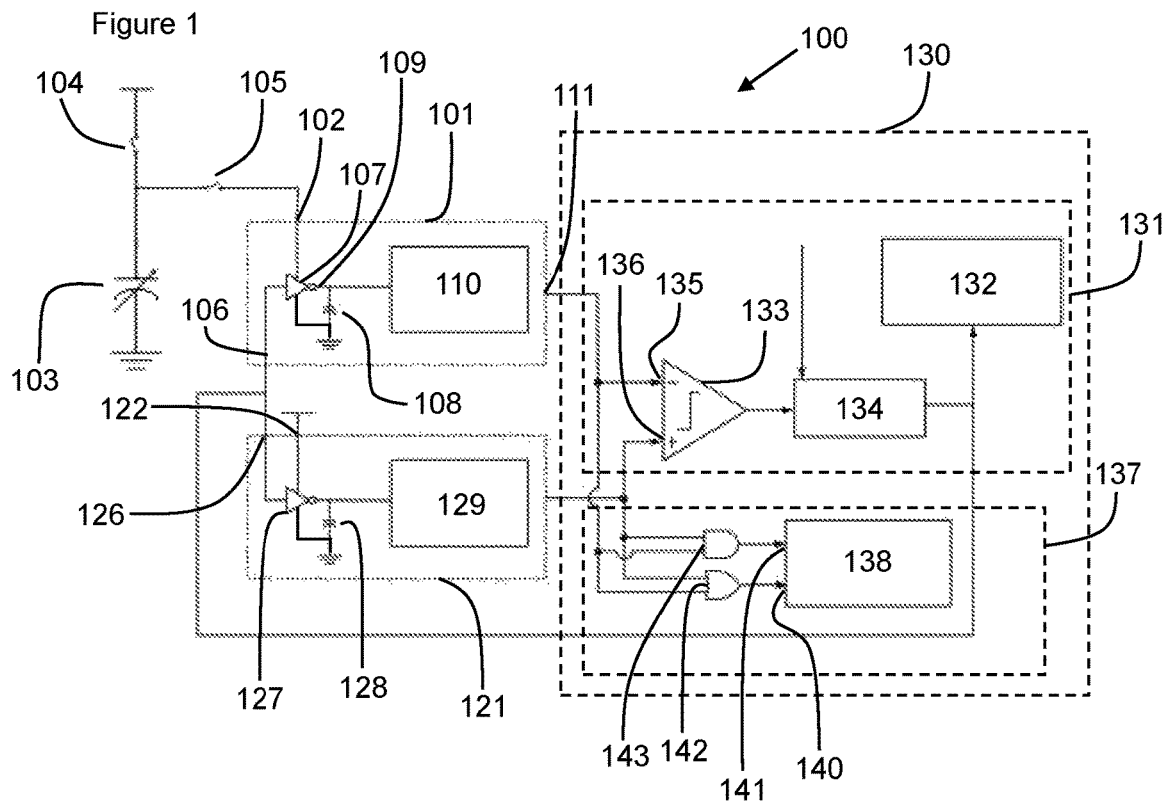
FIG. 1 shows an example embodiment of a capacitance-to-digital converter.

As shown in FIG. 1, a CDC 100 of the present embodiment comprises a first delay block 101 having an input node 102 configured to receive a voltage from a capacitive sensor 103. The capacitive sensor 103 is charged by closing an input switch 104 and opening a discharge switch 105, however, it will be appreciated that other isolating means may be used. This allows for a charge to be stored on the capacitive sensor 103 which provides a capacitive sensor voltage level. The first delay block 101 further comprises a clock node 106 configured to receive a clock signal defining a clock period until a subsequent clock signal. The first delay block 101 is configured to output a first output signal, at output node 111, after a first delay time in response to receiving the clock signal, the first delay time based on the voltage at the input node 102. In this embodiment, by way of closing the discharge switch 105 and opening the input switch, the input node 102 of the first delay block 101 receives the capacitive sensor voltage from the capacitive sensor 103. This allows for the iterative discharging of the capacitive sensor 103 based on the receipt of the clock signal. Each time the capacitive sensor 103 is partially discharged after each clock period, the first delay time of the first delay block 101 may be iteratively increased.

The clock signal may comprise a repeating signal that repeats with a period comprising the clock period. As such, time measurements may be made and the capacitive sensor iteratively discharged relative to a repeating feature of the clock signal, as will be described herein. However, as can be appreciated, the clock signal may take different forms. The clock signal may be defined as a signal which alternates between two logical values, such as a defined 1 and 0. A single clock signal extending over a single clock period can be defined to have a leading edge and a trailing edge, wherein the trailing edge of the clock signal comprises the leading edge of the subsequent clock signal. The leading edge of the clock signal may be arbitrarily defined and is normally defined as either a rising edge of the signal or a falling edge, however, the leading edge could be defined as any point during the alternation between the two logical values. The duration of the clock signal between the leading edge and the trailing edge can be defined as a clock period and each clock period therefore comprises one of each of the two logical values. In some embodiments, the clock period of each clock signal may be equal, or the clock period may vary. In one or more embodiments, the duration of a first of the logical values may be equal to the duration of the second of the logical values, while in other embodiments, the first of the logical values may be longer or shorter in duration than the second of the logical values. In the following discussion, it will be explained that the clock signal provides for control of the iterative discharging of the capacitive sensor 103. It will be appreciated that one of the two logical values that comprise the clock signal may provide for discharging of the voltage on the capacitive sensor 103 such that the discharging of the capacitive sensor 103 is provided in measurable and discrete pulses. It will further be appreciated that references to the receipt of a signal in the following disclosure may refer to receipt of the rising edge of a pulse in an output signal caused by the clock signal or to the receipt of the falling edge of a pulse, or to any other consistent repeating feature in the pulse which allows for a comparison between times of receipt to be made between output signals.

Based on receipt of the clock signal by the first delay block 101, a portion of the charge on the capacitive sensor 103 is discharged through the delay block 101, thereby reducing the voltage at the capacitive sensor 103. In some embodiments, the first delay block may comprise an inverter block 107 through which the charge flows. The function of the inverter block 107 is to connect capacitive sensor 103 in parallel with discharged first delay block load capacitor 108 during each clock period. To discharge the first delay block load capacitor 108, capacitive sensor 103 is disconnected from the first delay block load capacitor 108 and first delay block load capacitor 108 is connected to ground. In one or more embodiments, the inverter block 107 may comprise a plurality of switches.

The first delay block 101 may further comprise a level shifter 110. The level shifter 110 may be arranged between an inverter block output node 109 and an output node 111 of the first delay block 101 and configured such that the voltage of the first output signal generated by the first delay block 101 is shifted to a level which is appropriate for the subsequent components of the CDC 100.

The CDC 100 also comprises a second delay block 121. In this embodiment, the second delay block 121 comprises a reference delay block. The second delay block 121 also comprise an input node 122. The input node 122 of the second delay block 121 is configured to receive a first voltage wherein the first voltage is a constant voltage which is lower than the voltage on the capacitive sensor 103 prior to initiation of the iterative discharge of the capacitive sensor 103. The second delay 121 block also comprises a clock node 126 configured to receive the same clock signal. The second delay block 121 is configured to output a second output signal after a second delay time in response to receiving the clock signal, the second delay time based on the first voltage at the input node 122. In this embodiment, the second delay block 121 comprises an inverter block 127, a load capacitor 128 and a level shifter 129, as described in respect of the first delay block 101. It will be appreciated that any of the alternatives described in relation to the first delay block 101 may equally be applied to the components of the second delay block 121.

The CDC 100 comprises a capacitance determination unit 130 configured to determine a value indicative of a capacitance measurement of the capacitive sensor 103. The value indicative of the capacitance measurement of the capacitive sensor 103 is based on: the number of clock periods during which the first delay time was less than a third delay time; a first time difference between time of receipt of the first output signal and the second output signal by the capacitance determination unit 130 during a last clock period during which the first delay time is less than the third delay time; and a second time difference between time of receipt of the first output signal and the second output signal by the capacitance determination unit 130 during a first clock period during which the first delay time is greater than the third delay time. The third delay time comprises a constant time delay after a clock signal which is greater than or equal to the second time delay of the second output signal. The point at which the first delay time becomes greater than the third delay time during iterative discharging of the capacitive sensor 103 may comprise the point at which conversion of the capacitance sensed by the capacitive sensor to a digital signal is complete. The third delay time may be provided to the capacitance determination unit 130 in a plurality of different ways, as will be demonstrated in the following specific embodiments. In the embodiment described with reference to FIG. 1, the third delay time is the second delay time of the second output signal and the third delay time is therefore based on the first voltage. As such, the first time difference in this embodiment is the time difference between the time of receipt of the first output signal and the time of receipt of the second output signal by the capacitance determination unit 130 during a last clock period during which the first delay time is less than the second delay time. As such, the second time difference in this embodiment is the time difference between time of receipt of the first output signal and the second output signal by the capacitance determination unit 130 during a clock period during which the first delay time is shorter than the second delay time. It will be appreciated that, in this embodiment, the first and second delay times may be compared by comparing the time of receipt of the first and second output signals by the capacitance determination unit 130. In some embodiments, the third delay time is measured by the capacitance determination unit 130. In other embodiments, the third delay time may be a predetermined constant delay time available to the capacitance determination unit 130 for comparison of the first delay time with the third delay time, i.e., no measurement of the third delay time may be necessary, as it may be predetermined.

A plurality of embodiments will be disclosed herein of specific examples of how to achieve measurement of the number of clock periods, the first time difference and the second time difference, however, it will be appreciated that any other combination of components which provides for measurement of these three values will provide for a CDC 100 of this disclosure.

In one or more embodiments, the capacitance determination unit 130 may comprise a control unit 131 configured to count the number of clock periods during which the first delay time was less than the third delay time. In some embodiments, this may be achieved by counting the number of clock periods during which the first output signal was received prior to the second output signal by the capacitance determination unit 130.

The control unit may comprise a counter module 132 configured to count the number of clock periods during which the first delay time is less than the third delay time. In some examples, the control unit 131 further comprises a first comparator 133 and a digital control block 134 comprising an edge generator, the first comparator 133 configured to provide an output signal to the digital control block 134 which controls the edge generator to generate or stop generating a clock signal based on the output of the first comparator 133. In order to begin the iterative discharging of the capacitive sensor 103, a system trigger signal may be applied to the CDC 100, which initiates the generation of the clock signals by the edge generator. The first comparator 133 may comprise a first input node 135 configured to receive the first output signal and a second input node 136 configured to receive the second output signal. The first comparator 133 may comprise a time domain comparator, otherwise known as a delay comparator. The output signal of the first comparator 133 may be based on which of the first and second output signals is received earliest by the first comparator 133, in this embodiment, this measurement provides a comparison of the first delay time of the first output signal and the second delay time of the second output signal. As mentioned above, in this example embodiment, the second delay time is equivalent to the third delay time. For example, the first comparator 133 may be configured to provide an output signal to the digital control block 134 which causes the edge generator to provide for continued generation of the clock signal while the first output signal is received by the first comparator 133 prior to the second output signal, i.e., while the first delay time is less than the third delay time. The first comparator 133 may also be configured to provide an output signal to the digital control block 134 which provides a control signal to cause the edge generator to stop the generation of further clock signals when the second output signal is received by the first comparator 133 prior to the first output signal, i.e., when the first delay time becomes greater than the third delay time. The counter module 132 may be configured to count the number of clock signals generated by the edge generator and, in this way, the number of clock periods during which the first output signal was received prior to the second output signal is calculated in order to provide for the value indicative of the capacitance sensed by the capacitive sensor 103. This number of complete clock periods may be referred to as the coarse component of the value indicative of the capacitance sensed by the capacitive sensor 103.

The capacitance determination unit 130 may also comprise a fine measurement unit 137, the fine measurement unit 137 configured to receive the first and second output signals and the fine measurement unit 137 further comprising a time-to-digital converter (TDC) 138 wherein the TDC 138 is configured to at least measure the first time difference and the second time difference. The TDC 138 comprises two input nodes and receives one signal at each input node. In this embodiment, the two input nodes comprise a start node 140 and a stop node 141 such that the TDC 138 begins counting when a signal is received at the start node 140 and the TDC 138 stops counting when a signal is subsequently received at the stop node 141. It will be appreciated that the TDC may take the final measurement of the time difference between receipt of the first and second output signals to be the second time difference and the penultimate measurement of the time difference between receipt of the first and second output signals as the first time difference. In this example, the start node 140 of the TDC 138 is connected to the output of a logical OR gate 142 with the OR gate 142 configured to receive at its first and second input nodes the first output signal and the second output signal, respectively. By this arrangement, the TDC 138 will start counting when either of the first and second output signals is received by the OR gate 142. The stop node 141 of the TDC 138 is connected to a logical AND gate 143 with the AND gate 143 configured to receive at its first and second input nodes the first output signal and the second output signal, respectively. Since, in this embodiment, both the first and second output signals provide a logical 1 value for a duration longer than the difference in the first and second delay times, the AND gate 143 will, at some point, receive both the first and second output signals with a logical 1 value simultaneously. Thus, when the second of the first and second output signals is received by the AND gate 143, the AND gate 143 will provide an output signal which instructs the TDC 138 to stop counting. It will be appreciated that, while OR and AND gates 142, 143 are shown in the present embodiments, other logic gates or combinations of logic gates may be used to produce the same results, such as NAND gates, NOR gates, XOR gates, etc.

Where the first output signal was received by the logical gates 142, 143 of the fine measurement unit 137 before the second output signal, during the last clock period during which the first delay time was less than the third delay time, the time difference measured by the TDC 138 is the first time difference. Where the second output signal was received by the logical gates 142, 143 of the fine measurement unit 137 before the first output signal, during the first clock period during which the first delay time was greater than the third delay time, the time differenced measured by the TDC 138 is the second time difference. In this embodiment, the TDC 138 measures the time difference between receipt of the first output signal and receipt of the second output signal for every clock period after the edge generator is activated using the system trigger signal. The system trigger signal may also be used to activate the TDC 138. The TDC 138 may record the value of the first time difference and the second time difference after measurement for use in determining the value indicative of the capacitance sensed by the capacitive sensor 103. The TDC 138 may be a ring-oscillator type TDC.

Figure 2:
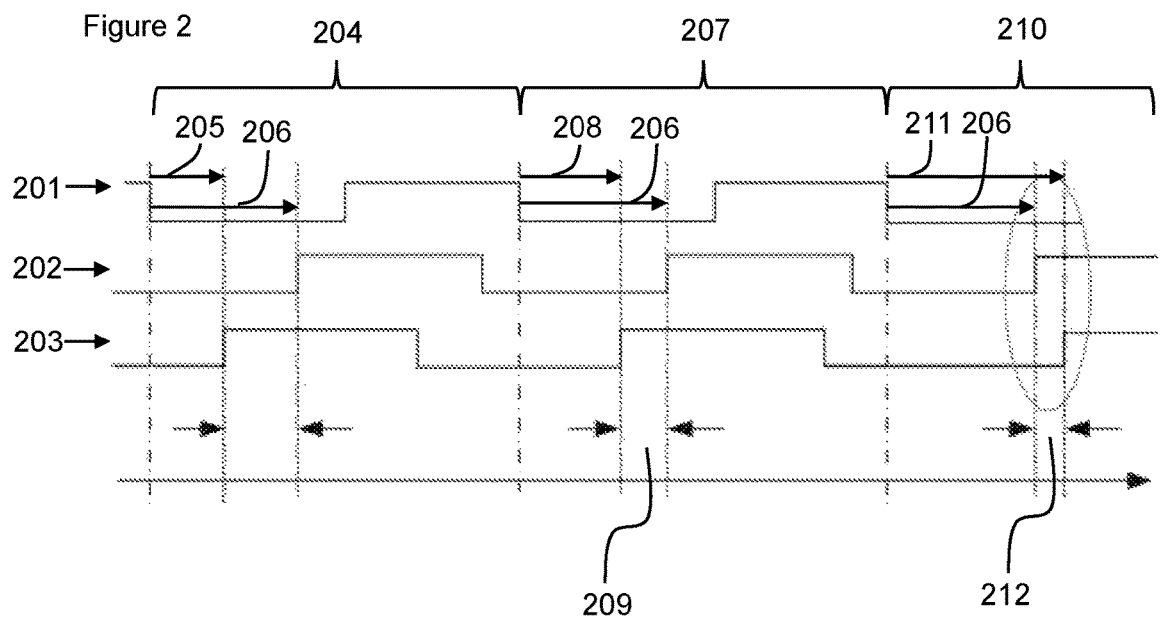
FIG. 2 shows an example signal timing diagram for the capacitance-to-digital converter of FIG. 1.

FIG. 2 depicts an example signal timing diagram showing the relative time delays between consecutive clock signals 201 and the corresponding first output signal 203 and the corresponding second output signals 202. In typical operation of the first embodiment, the clock signal 201 is generated by the edge generator and provided to the first and second delay blocks 101, 121. As shown in FIG. 2, during a first clock period 204 the first delay time 205 of the first output signal 203 based on the capacitive sensor voltage may initially be shorter than the second delay time 206 of the second output signal 202 based on the first voltage, wherein the second delay time 206 in this embodiment is the third delay time 206. During a second clock period 207, the first delay time 208 of the first output signal 203 may also be shorter than the second delay time 206 of the second output signal 202, however, the difference between the first and second delay times 209 may be shorter than in the first clock period 204 due to the reduction in voltage at the capacitive sensor 103 due to the iterative discharge during the first clock period 204. The second clock period 207 of this example comprises the last clock period in which the first delay time 208 is shorter than the second delay time 206 and, as such, the time difference between receipt of the first output signal 203 and the second output signal 202 is the first time difference 209. In a third clock period 210, the first delay time 211 is greater than the second delay time 206 and, as such, the time difference between receipt of the second output signal and the first output signal is the second time difference 212. Since the second output signal 202 was received prior to the first output signal 203 in the third clock period 210 of this example, no further clock signals are generated.

Figure 3:
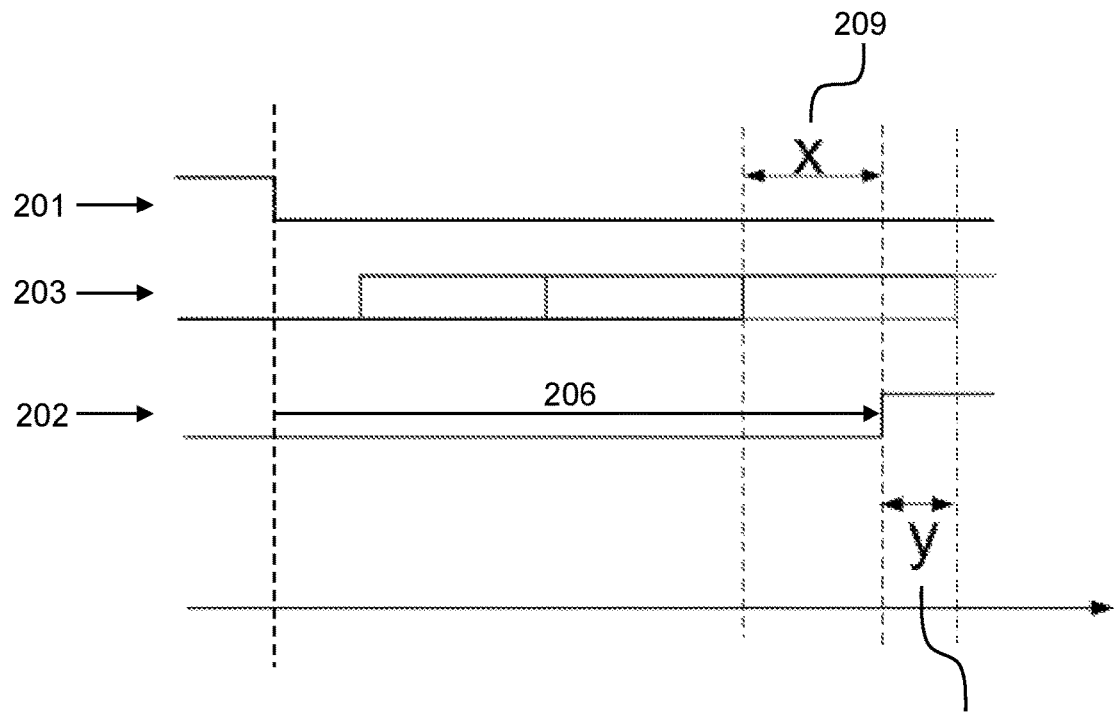
FIG. 3 shows an example synchronised signal timing diagram for the capacitance-to-digital converter of FIG. 1.

FIG. 3 depicts an example signal timing diagram for a plurality of consecutive clock periods, where each of the clock periods have been aligned and overlaid with each other. Since the clock periods are aligned and overlaid, only a single clock signal 201 is shown in this figure and only a single rising edge can be seen for the second output signal 202 because the second delay time 206, equal to the third delay time 206 of this embodiment, between the clock signal 201 and the second output signal is equal in each clock period due to the constant voltage at the input node of the second delay block 121. As described previously and represented in FIG. 3, the rising edge of the first output signal 203 arrives later and later in each subsequent clock period relative to the falling edge of the clock signal 201 due to the iterative discharge of the capacitive sensor 103 providing for longer first delay times 205, 208, 211 in each clock period 204, 207, 210. Eventually, the rising edge of first output signal 203 is received by the capacitance determination unit 130 after the rising edge of the second output signal 202, providing for determination of the first and second time differences. While only three clock periods have been described here and depicted in FIGS. 2 and 3, it will be appreciated that tens, hundreds, thousands, or more clock periods may precede the last clock period in which the first delay time is less than the third delay time.

The value indicative of the capacitance sensed by the capacitive sensor 103 may be based on a coarse component and a fine component. The coarse component may comprise the number of clock cycles received by the counter module 132 before the first delay time is less than the third delay time. The fine component may comprise a ratiometric component comprising the first time difference divided by the sum of the first time difference and the second time difference, i.e.:

$$\frac{x}{x+y}$$

where x is the first time difference 209 and y is the second time difference 212. The value indicative of the capacitance sensed by the capacitive sensor 103 may be the sum of the coarse component and the fine component. It will be appreciated that the CDC 100 may not be configured to perform the step of calculating the capacitance, but instead the function of the CDC 100 may be to record all of the values required in order to determine the capacitance sensed by the capacitive sensor 103. As such, the CDC 100 may be configured to determine the coarse code and the relevant time differences, including at least the first and second time differences, and provide these to another device or component for calculating the value indicative of the capacitance sensed by the capacitive sensor. Alternatively, the CDC may be configured to determine the value indicative of the capacitance sensed by the capacitive sensor and leave calculation of the capacitance to another device. Alternatively, the CDC 100 may be configured to perform all steps necessary to determine the capacitance measurement of the capacitive sensor 103.

Figure 4:
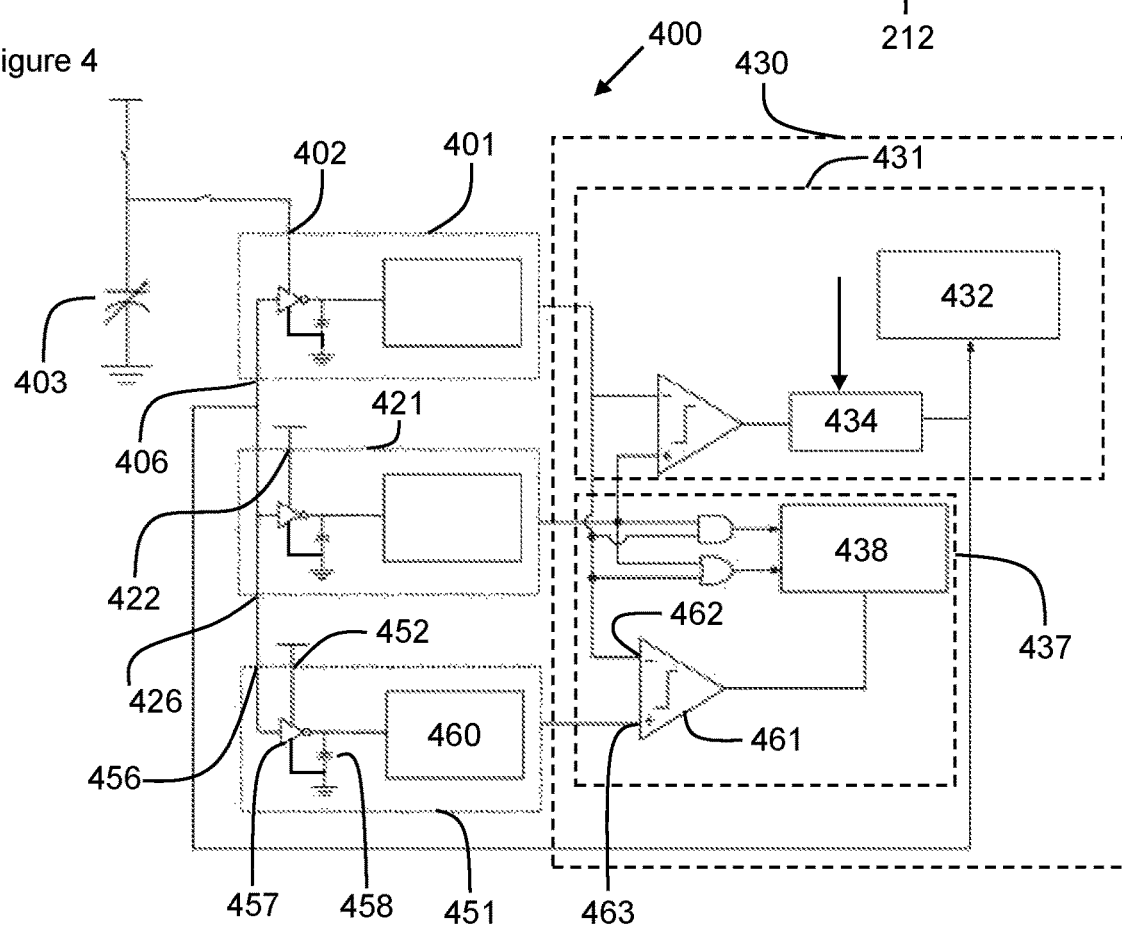
FIG. 4 shows an example embodiment of a capacitance-to-digital converter having a trigger delay block for activating a time-to-digital converter.

In the first embodiment described above with reference to FIGS. 1-3, the TDC 138 is activated each clock period, however, only the first time difference 209 and the second time difference 212 measured in the last two clock periods need to be measured by the TDC 138, i.e. for the fine component. An alternative embodiment may be provided, as shown in FIG. 4, wherein a trigger delay block 451 is added to the CDC 400 which provides for activation of the TDC 438 from a deactivated state prior to the last clock period during which the first delay time is less than the third delay time. In this example, the system trigger signal does not activate the TDC 438 when the edge generator 434 is activated. This may provide for power savings, as the TDC 438 does not make unnecessary time difference measurements and may also provide for the use of lower amounts of memory in the recording of unnecessary time differences. The trigger delay block 451 may be configured to activate the TDC 438 for the last clock period during which the first delay time is less than the third delay time or it may activate the TDC 438 at any time after at least one clock period and before the last clock period during which the first delay time is less than the third delay time.

As shown in FIG. 4, the trigger delay block 451 may comprise a third inverter block 457 having an input node 452 configured to receive a second voltage higher than the first voltage and a clock node 456 configured to receive the clock signal. The trigger delay block 451 may be configured to output a third output signal after a fourth delay time in response to the clock signal, the fourth delay time based on the second voltage. The second voltage of this embodiment is a constant voltage higher than the first voltage, and therefore the fourth delay time of the third output signal will be correspondingly shorter than the second delay time of the second output signal, wherein the second delay time in this embodiment is the third delay time. In this embodiment, the third delay block 451 comprises an inverter block 457, a load capacitor 458 and a level shifter 460, as in the first and second delay blocks 401, 421. It will be appreciated that any of the alternatives described in relation to the first delay block 401 may equally be applied to the components of the third delay block 451.

In this embodiment, the capacitance determination unit 430 may comprise a second comparator 461. More specifically, in some embodiments, the fine measurement unit 437 may comprise the second comparator 461. The second comparator 461 may comprise a first input node 462 configured to receive the first output signal and the second comparator 461 may further comprise a second input 463 node configured to receive the third output signal. The second comparator 461 may be configured to provide an output signal configured to activate the TDC 438 when the first output signal is received by the second comparator 461 after the third output signal during a single clock period. Since the second voltage is higher than the first voltage and the fourth delay time is consequently shorter than the second delay time, in this embodiment, the TDC 438 will be activated before the last clock period during which the first delay time is less than the third delay time. In this embodiment, the remainder of the components and calculations of the value indicative of the capacitance sensed by the capacitive sensor are the same as for those described in the first embodiment which were described with reference to FIGS. 1 to 3.

In summary, this second embodiment provides a capacitance to digital converter 400 comprising:
- a first delay block 401 having an input node 402 configured to receive a voltage from a capacitive sensor 403 and a clock node 406 configured to receive a clock signal defining a clock period until a subsequent clock signal, the first delay block 401 configured to output a first output signal after a first delay time in response to receiving the clock signal, the first delay time based on the voltage at the input node 402, and wherein the first delay block 401 is configured to provide for iterative discharging of the capacitive sensor 403 based on the clock signal;
- a second delay block 421 having an input node 422 configured to receive a first voltage and a clock node 426 configured to receive the clock signal, the second delay block 421 configured to output a second output signal after a second delay time in response to the clock signal, the second delay time based on the first voltage;
- a third delay block 451, being a trigger delay block, having in input node 452 configured to receive a second voltage and a clock node 456 configured to receive the clock signal, the third delay block configured to output a third output signal after a fourth delay time in response to the clock signal, the fourth delay time based on the second voltage and the fourth delay time shorter than the second delay time; and
- a capacitance determination unit 430 comprising:
  - a control unit 431, the control unit 431 comprising a counter module 432, the counter module 432 configured to count the number of clock periods during which the first delay time was less than the second delay time; and
  - a fine measurement unit 437, the fine measurement unit 437 configured to receive the first and second output signals and the fine measurement unit 437 comprising a time-to-digital converter 438, wherein the time-to-digital converter is configured to at least measure the first time difference and the second time difference, wherein the third delay block 451 is configured to provide for activation from a deactivated state of the time-to-digital converter 438 to allow for determination of the difference between time of receipt of the first output signal and the second output signal:
    - a) after at least one clock period; and
    - b) before the last clock period during which the first time
  - difference was less than the second time difference; and
- wherein the capacitance determination unit 430 is configured to determine a value indicative of capacitance of the capacitive sensor 403 based on:
  - the number of clock periods during which the first delay time was less than the second delay time;
  - a first time difference between time of receipt of the first output signal and the second output signal by the capacitance determination unit 430 during a last clock period during which the first delay time was less than the second delay time; and
  - a second time difference between the time of receipt of the first output signal and the second output signal by the capacitance determination unit 430 during a first clock period during which the first delay time was greater than the second delay time.

A TDC may also comprise an internal offset which can cause errors in measured time differences. In one or more other embodiments, the output signal of a trigger delay block may also be used as a common reference which cancels the offset of the TDC. This is achieved by providing for operation of the CDC in two modes: a calibration mode and a measurement mode. In this embodiment, the value indicative of the capacitance sensed by the capacitive sensor will be based on the time difference between receipt of output signals generated by the iterative discharge of the capacitive sensor and by the output signal generated by the trigger delay block during both the last period during which the first delay time was less than the third delay time and the first clock period during which the first delay time was greater than the third delay time, both measured during the measurement mode. In addition, in this embodiment, the value indicative of the capacitance sensed by the capacitive sensor will be based on the time difference between receipt of the output signal generated by the trigger delay block and an output signal based on a reference voltage, which will be called a third time difference and measured during the calibration mode. In this embodiment, the output signal based on the reference voltage defines the third delay time. For this reason, in the following embodiments, the trigger delay block comprises the second delay block and the output signal based on a reference signal will be referred to as the fourth output signal having the third delay time based on a third voltage. As will be demonstrated in the following specific examples, the fourth output signal may be provided to the capacitance determination unit in a number of different ways. It will be appreciated that this output signal has been called the fourth output signal in order to avoid confusion with output signals of previous embodiments, and that, therefore, no third output signal is required in these embodiments. It will be appreciated that the CDC may operate in the calibration mode either before the measurement mode has been entered or part-way through the iterative discharging of the capacitive sensor in the measurement mode but before the last clock period during which the first delay time is less than the third delay time. A single calibration mode measurement may be used for multiple sensor capacitance measurements as long as the circuit parameters do not drift significantly since the calibration mode measurement.

Figure 5:
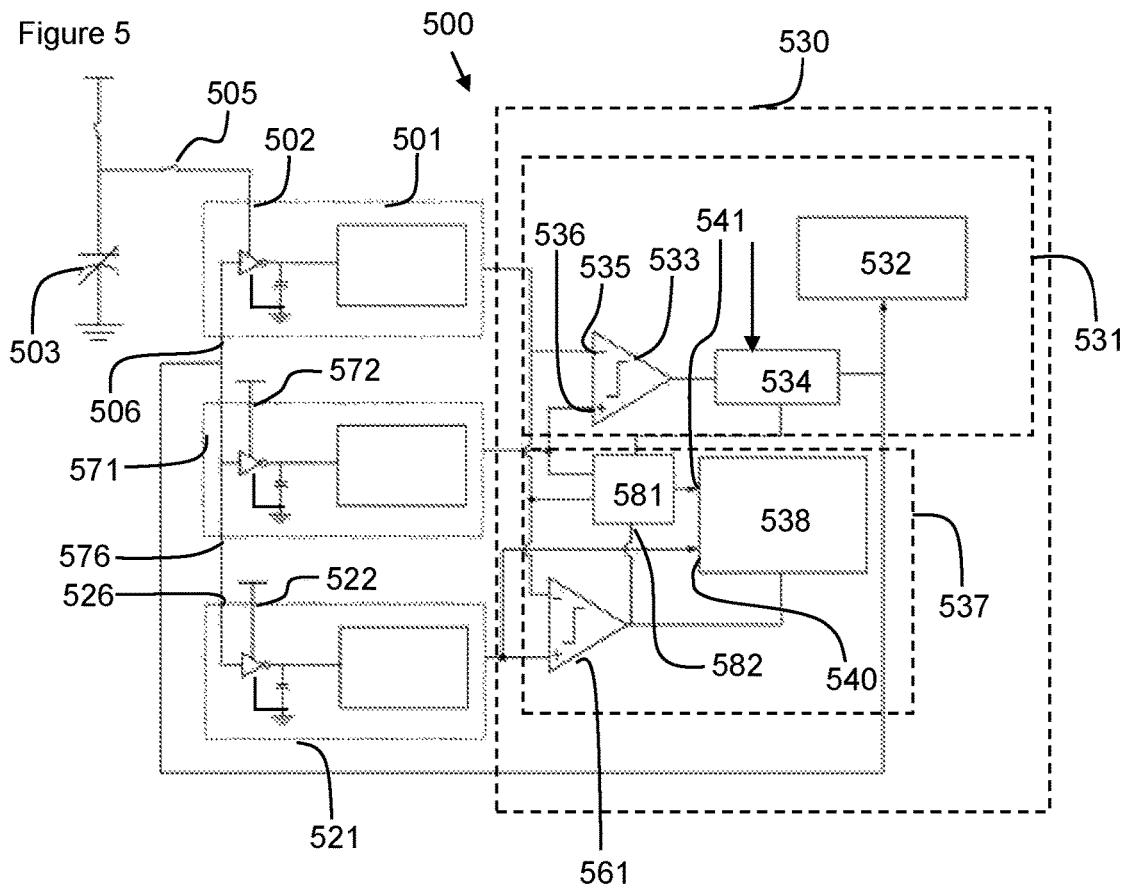
FIG. 5 shows a further example embodiment of a capacitance-to-digital converter having a trigger delay block.

As shown in FIG. 5, in one or more embodiments, the second delay block 521 comprises the trigger delay block and the CDC 500 further comprises a fourth delay block 571 having an input node 572 configured to receive the third voltage and a clock node 576 configured to receive the clock signal, the fourth delay block 571 configured to output the fourth output signal after the third delay time in response to the clock signal.

In this embodiment, a second input node 536 of the first comparator 533 of the control unit 531 is configured to receive the fourth output signal and the first input node 535 of the first comparator 533 is configured to receive the first output signal. Due to this arrangement, the first comparator 533 is configured to provide an output to the digital control block 534 which, in turn, controls the edge generator to cause the edge generator to stop the generation of clock signals during a first clock period during which the fourth output signal was received by the first comparator 533 prior to the first output signal, i.e., no further clock signals will be generated when the first delay time is greater than the third delay time.

The fine measurement unit 537 of this example also comprises a second comparator 561 configured to receive the first output signal and the second output signal and, when the second comparator detects that the first output signal is received after the second output signal, the second comparator is configured to provide an output signal configured to activate the TDC 538 from a deactivated state. As in the embodiment described in relation to FIG. 4, this may provide for power savings compared to operating the TDC 538 during every clock period. The output of the second comparator 561 is further connected to a control node 582 of a switching device 581 which is configured to receive two different input signals at first and second input nodes and output one of those two input signals based on a signal received at the control node 582. The digital control block 534 may also be configured to provide for an override control signal to the control node 582 of the switching device 581 such that the digital control block 534 can provide for switching of the signal output by control block between the inputs of the switching block. In this way, the digital control block may provide for control of the calibration and measurement modes. The calibration may, thus, be entered before, during or after the measurement mode. The calibration mode may not be entered after the measurement mode in embodiments where knowledge of the third time difference is required for operation of the CDC. For example, the switching device 581 may comprise a multiplexer. The switching device 581 may be configured to receive the first output signal and the fourth output signal at its first and second input nodes and the selection of the first output signal and the fourth output signal to be provided to the TDC 538 may be based on the output of the second comparator 561 at the control node 582. The switching device 581 may allow the CDC 500 to operate in a calibration mode, in some embodiments by the application of an override control signal from the digital control block 534, wherein the fourth output signal is provided to the TDC 538 and is compared to the second output signal of the second delay block, received at a second input 540 node of the TDC 538, in order to calculate the third time difference. In the calibration mode, the capacitive sensor 503 may be disconnected from the input node 502 of the first delay block 501 by way of opening the discharge switch 505. Alternatively, the third time difference may be calculated by the TDC 538 during the iterative discharging of the capacitive sensor 503 before the last clock period during which the first delay time is less than the third delay time, however, in such an arrangement, the TDC 538 would have to be configured to be activated prior to the first output signal being received by the capacitance determination unit 530 after the second output signal. Such an embodiment may provide for time saving in performing simultaneous calibration and measurement at the expense of power efficiency, as the TDC 538 may need to be activated for longer than in other embodiments or for the whole duration of the iterative discharging of the capacitive sensor 503. When the first output signal is received by the second comparator 561 after receipt of the second output signal, the output of the second comparator 561 may provide for switching of the output of the switching device 581 to provide the first output signal to the TDC 538. It will be noted that, in this embodiment the AND/OR gate arrangement is unnecessary, as the TDC 538 will only take measurements of the time difference between receipt of the first and second output signals when the second output signal is received by the capacitance determination unit 530 prior to first output signal. As such, the TDC 538 is configured to receive the second output signal at a start node 540 of the TDC 538 and also to receive the output of the switching device 581 at a stop node 541, such that the first output signal is provided to the TDC 538 for measurement of the first and second time differences.

The third time difference may be recorded during operation in the calibration mode so that the third time difference can be used in the calculation of the value indicative of the capacitance sensed by the capacitive sensor 503. Data relating to the third time difference may be stored in the TDC 538, in a memory comprising part of the CDC 500 or on an external memory. The first and second time differences may also be stored in the same manner as the third time difference or in any other way In summary, this embodiment provides a capacitance to digital converter 500 comprising:
a first delay block 501 having an input node 502 configured to receive a voltage from a capacitive sensor 503 and a clock node 506 configured to receive a clock signal defining a clock period until a subsequent clock signal, the first delay block configured to output a first output signal after a first delay time in response to receiving the clock signal, the first delay time based on the voltage at the input node 502, and wherein the first delay block 501 is configured to provide for iterative discharging of the capacitive sensor 503 based on the clock signal;
a second delay block 521, being a trigger delay block, having an input node 522 configured to receive a first voltage and a clock node 526 configured to receive the clock signal, the second delay block 521 configured to output a second output signal after a second delay time in response to the clock signal, the second delay time based on the first voltage;
a fourth delay block 571 having an input node 572 configured to receive a third voltage and a clock node 576 configured to receive the clock signal, the fourth delay block 571 configured to output a fourth output signal after a third delay time in response to the clock signal, the third delay time based on the third voltage wherein the third delay time is longer than the second delay time; and
a capacitance determination unit 530 comprising:
a control unit 531, the control unit 531 comprising a counter module 532, the counter module 532 configured to count the number of clock periods during which the first delay time is less than the third delay time; and
a fine measurement unit 537, the fine measurement unit 537 configured to receive the first and second output signals and the fine measurement unit 537 comprising a time-to-digital converter 538, wherein the time-to-digital converter 538 is configured to at least measure a first time difference and a second time difference, wherein the second delay block 521 is configured to provide for activation from a deactivated state of the time-to-digital converter 538 to allow for determination of the difference between time of receipt of the first output signal and the second output signal:
a) after at least one clock period; and
b) before the last clock period during which the first delay time is less than the third delay time;
wherein the CDC 500 is configured to operate in:
a calibration mode, in which the time-to-digital converter 538 is configured to determine a third time difference wherein the third time difference is the difference between a time of receipt of the fourth output signal and a time of receipt of the second output signal; and
a measurement mode for iterative discharging of the capacitive sensor 503 wherein the capacitance determination unit 530 is configured to determine a value indicative of capacitance of the capacitive sensor 503 based on:
- the number of clock periods during which the first time difference was less than the third time difference;
- the first time difference between time of receipt of the first output signal and the second output signal by the capacitance determination unit 530 during a last clock period during which the first delay time is less than the third delay time;
- the second time difference between time of receipt of the first output signal and the second output signal by the capacitance determination unit 530 during a first clock period during which the first delay time was greater than the third delay time; and
- the third time difference.

Figure 6:
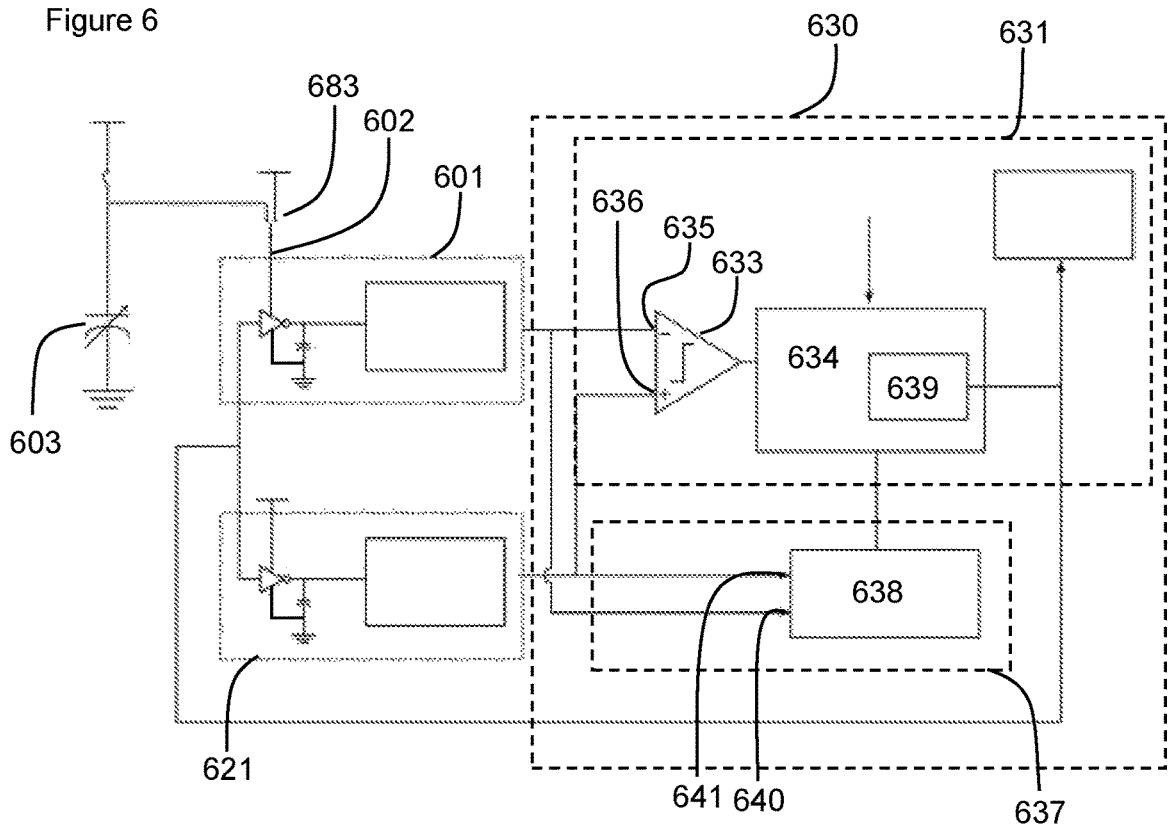
FIG. 6 shows an example embodiment of a capacitance-to-digital converter having a trigger delay block and a switchably connected input to a first delay block.

As shown in FIG. 6, an alternative embodiment of the present disclosure which utilises a calibration mode and a measurement mode may only comprise two delay blocks. In this embodiment, a switchable connection for the input node 602 of the first delay block 601 is provided between the capacitive sensor 603 and the third voltage such that the first delay block 601 is configured to output either the first output signal or the fourth output signal having the third delay time based on the third voltage. In such an embodiment, the time differences of receipt by the capacitance determination unit 630 between the first output signal and the fourth output signal is not directly measured for any purpose. Instead, the time difference between receipt of the first output signal and the second output signal and the time difference between receipt of the second output signal and the fourth output signal (the third time difference) are measured. In this embodiment, the third time difference is used not only for the determination of the value indicative of the capacitance sensed by the capacitive sensor 603 but also for determination of when to stop the generation of clock signals, as the third time difference is indicative of the third delay time. An example according to this embodiment may provide for additional power savings, as the third voltage does not need to be applied to the reference node 683 which provides the third voltage except during the calibration mode. This is in contrast to the embodiment described with reference to FIG. 5 where the third voltage needed to be constantly supplied in order to provide for control of the first comparator 533 and thereby the edge generator via the digital control block 534. In addition, static mismatch in delay between the first output signal and the fourth output signal may be a problem in the three-delay block topology, however, this may not be a problem in a two-delay block topology.

In this example, the input node 602 of the first delay block 601 is switchably connected between the capacitive sensor 603 and a reference node 683, wherein the reference node is configured to provide the third voltage to the first delay block 601 when the first delay block is connected thereto when operating in the calibration mode. Thus, when the input node 602 of the first delay block 601 is connected to the reference node 683, the first delay block 601 is configured to output the fourth output signal after the third delay time after receipt of the clock signal and, in the measurement mode, the input node 602 of the first delay block 601 is connected to the capacitive sensor 603. It will be appreciated that the discharge switch 105 is not shown in FIG. 6, as the input node 602 of the first delay block 601 may be connected to the reference node 683 when not operating in the measurement mode or during charging of the capacitive sensor and, as such, the discharge switch may not be necessary. However, in other embodiments, the discharge switch 105 may be provided in addition to the switchable arrangement of the input node 602 of the first delay block 601.

When operating in the calibration mode, the supply of the first delay block 601 is connected to the reference node. Due to the voltage differences between the input nodes of the first and second delay blocks 601, 621 in the calibration modes, the fourth and second output signals will be received by the capacitance determination unit 630 at different times, i.e., with the second and third delay times relative to the clock signal. Because the first voltage is higher than the third voltage, the second output signal will be received by the capacitance determination unit 630 prior to the fourth output signal. The time difference between the receipt of the second and fourth output signals by the capacitance determination unit 630, the third time difference, will be measured by the TDC 638. The third time difference is recorded for use when operating in the measurement mode.

When operating in the measurement mode, the input node 602 of the first delay block 601 is connected to the capacitive sensor 603. The iterative discharging of the capacitive sensor 603 reduces the voltage across the capacitive sensor 603, which increases the first delay time. As a result, the voltage at the input node of the first delay block 601 eventually becomes lower than the third voltage previously provided to the input node of the first delay block 601, causing the first delay time to become greater than the third delay time. The first comparator 633 is configured to receive at its first input node 635, the first output signal and at its second input node 636, the second output signal. When the first output signal is received by the first comparator 633 later than the second output signal, the first comparator 633 provides an output signal to the digital control block 634. The digital control block 634 analyses the output signal and, on determining that the first output signal was received by the first comparator 633 later than the second output signal, the digital control block 634 is configured to provide an activation signal to a control node of the TDC 638 causing the TDC 638 to begin measurement of the time difference of receipt between the first and second output signals during subsequent clock periods. When the voltage on the capacitive sensor 603 is lower than the third voltage, the time difference between receipt of the first output signal and the second output signal by the capacitance determination unit 630 will be larger than the third time difference, i.e., the first time delay will be greater than the third time delay. At this point, a control signal may be provided by the digital control block 634 to the edge generator 639 in order to cause the edge generator 639 to stop generating clock signals. In this way, the first comparator 633 in this embodiment may, by way of sending control signals to the digital control block 634, provide for both the activation of the TDC 638 and control of the edge generator 639 and so may be considered to perform the function of both the first comparator and the second comparator of other embodiments described above. It will be appreciated that in other embodiments, a second comparator may be provided in a two delay block topology such as that shown in FIG. 6, with a first comparator used for control of the edge generator 639 and a second comparator used for control of the TDC 638. It will be appreciated that, in this embodiment, the edge generator 639 has been highlighted as a separate component within the digital control block 634, as has been described for previous embodiments. It will be appreciated, however, that in some embodiments the edge generator 639 may comprise a separate component to the digital control block 634 and the digital control block 634 may be configured to provide an output control signal to the edge generator 639 for control thereof.

In this embodiment, the TDC 638 receives the second output signal at its start input node 640 and the first output signal or the fourth output signal at its stop input node 641, depending on whether the CDC 600 is operating in the measurement or calibration mode. Again, no logic gate input is required in this embodiment because no measurements of the time difference between the first and second output signals will be recorded until the second output signal is received prior to the first output signal due to the activation signal provided by the first comparator, i.e., until the first delay time is longer than the second delay time.

Figure 7A:
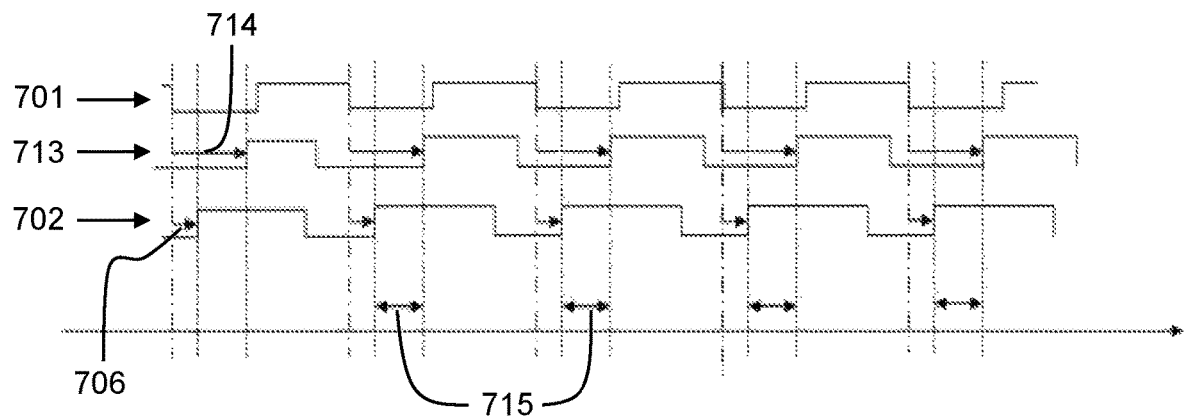
FIGS. 7A and 7B show a signal timing diagram for the capacitance-to-digital converter of FIG. 6.
Figure 7B:
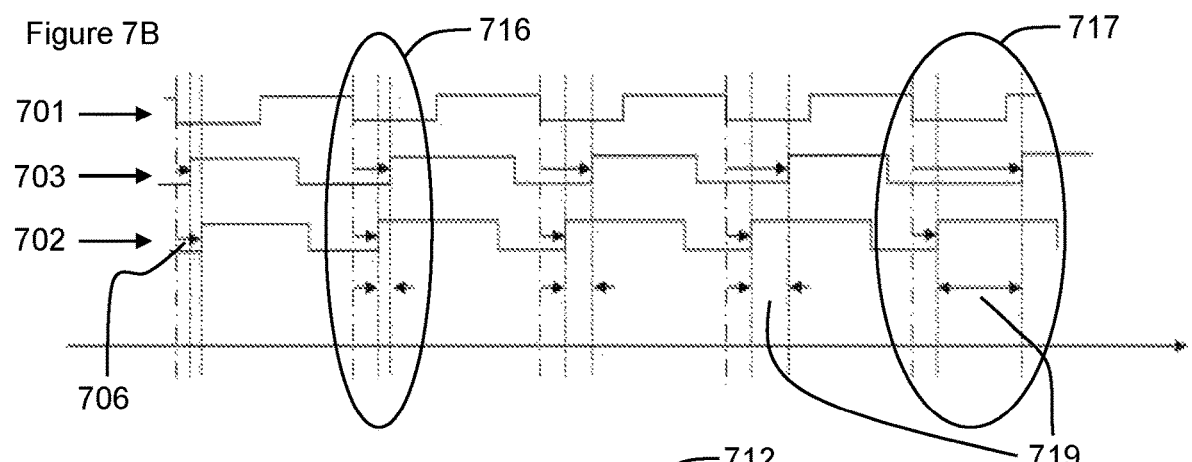

FIGS. 7A and 7B depicts example timing diagrams representing the signals discussed in relation to FIG. 6. FIG. 7A depicts the signals present when operating in a calibration mode and FIG. 7B depicts the signals present in the measurement mode. As shown in FIG. 7A, during operation in the calibration mode, the clock signal 701 is generated by the edge generator 639 and provided to the first and second delay blocks 601, 621. In the calibration mode, the input node 602 of the first delay block 601 is connected to the reference node 683 which provides the third voltage to the input node 602. As such, the fourth output signal 713 is generated by the first delay block 601 in response to the clock signal a third delay time 714 after the falling edge of the clock signal 701. In response to the same clock signal 701, the second output signal 702 is provided by the second delay block 621 wherein the second delay time 706 of the second output signal 702 is based on the first voltage received at the input node 622 of the second delay block 621. The TDC 638 will be active during operation in the calibration mode such that the TDC 638 measures the time difference between receipt of the second output signal 706 and the fourth output signal 713, i.e., the third time difference 715. Since the first voltage and the third voltage are constant, the third time difference 715 will be the same during each clock period. The TDC 738 may be configured to only take a single measurement of the third time difference 715 during operation in the calibration mode or the TDC 738 may be configured to record the third time difference 715 a plurality of times in order to provide for an average third time difference. Providing for an average third time difference may reduce errors in the measurement resulting from noise or other measurement inaccuracies.

FIG. 7B depicts the signals present when operating the CDC 600 in a measurement mode in an embodiment such as that shown in FIG. 6. In the measurement mode, the clock signal 701 is generated by the edge generator 634 and provided to the first and second delay blocks 601, 621. In the measurement mode, the input node 602 of the first delay block 601 is connected to the capacitive sensor 603 which provides the capacitive sensor voltage to the input node 602. As such, the first output signal 703 is generated by the first delay block 601 in response to the clock signal 701 a first delay time after the falling edge of the clock signal. In response to the same clock signal 701, the second output signal 702 is provided by the second delay block 621 wherein the second delay time 706 of the second output signal 702 is based on the first voltage at the input node 622 of the second delay block 621. The first comparator 633 provides for activation of the TDC 638 from a deactivated state when it receives the first output signal 703 after the second output signal 702, i.e., when the first delay time is longer than the second delay time, as shown at 716. For each subsequent clock period, the TDC 638 will measure the time difference between receipt of the first output signal 703 and the second output signal 702. A control signal is provided to the edge generator 639 by the digital control block 634 which stops the generation of clock signals 701 by the edge generator 639 when the time difference 719 between receipt of the first output signal and the second output signal is greater than the third time difference 715, as shown at 717, i.e., when the first delay time is longer than the third delay time. The digital control block 634 may be configured to determine and/or record the time differences disclosed herein and may further be configured to perform comparisons between delay times and the time differences. The digital control block may further be configured to provide for calculation of the value indicative of the capacitance sensed by the capacitive sensor.

It will be appreciated that the embodiment described with reference to FIG. 5 may use the same signals as shown in FIGS. 7A and 7B, but the fourth output signal will be provided when operating in the measurement mode and the calibration mode.

Figure 8:
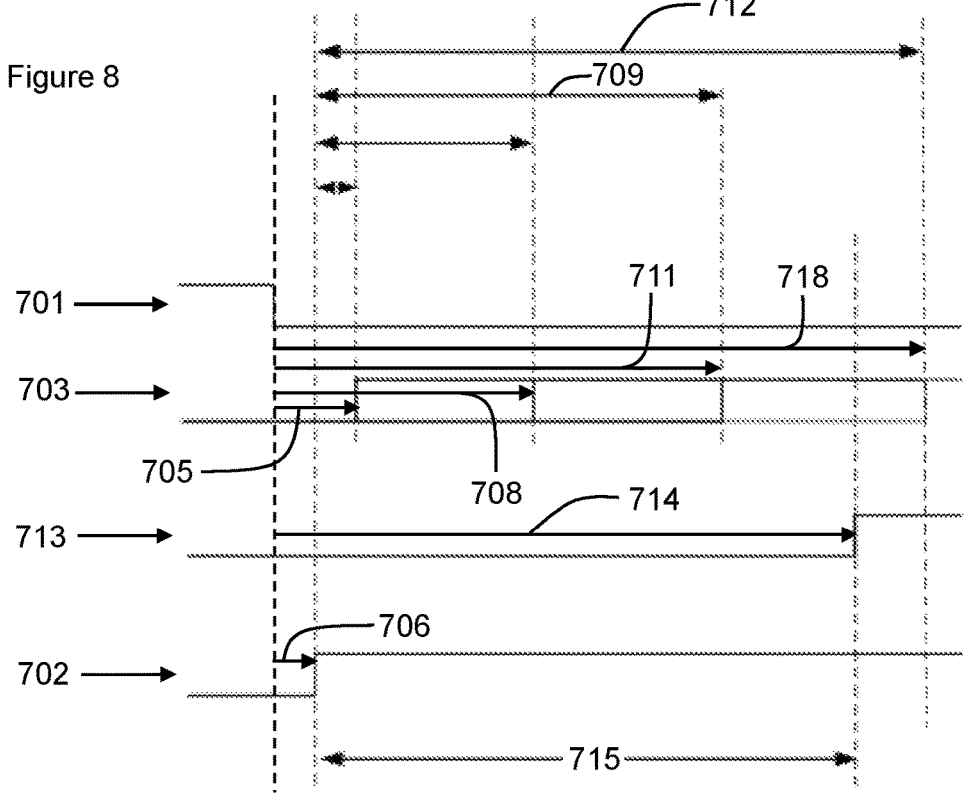
FIG. 8 shows a synchronised signal timing diagram for either of the capacitance-to-digital converters of FIG. 5 or 6.

FIG. 8 depicts the signals shown in FIGS. 7A and 7B with each of the clock periods synchronised such that the clock signals 701 overlay with each other. This also results in an overlay of the second output signal 702 and the fourth output signal 713. It will be appreciated that, in this figure, the signals from operation in both the calibration mode and the measurement mode are provided in a single figure for ease of comparison between the delay times and time differences. The delay time between the clock signal 701 and the second output signal 702 of this embodiment and the delay time between the clock signal 701 and the fourth output signal 713 can be clearly identified as constant time differences. In contrast, the change in the first delay time 705, 708, 711, 718 of the first output signal 703 is clearly identifiable. In this example, there are three clock periods during which the first delay time 705, 708, 711 is both greater than the second delay time 706 and less than the third delay time 714. The fourth of the first clock periods depicted in FIG. 8 shows the first clock period during which the first delay time 718 is longer than the third delay time 714. As discussed previously, the fine component of the value indicative of the capacitance sensed by the capacitive sensor 603 is based on the first time difference 709, the second time difference 712 and the third time difference 715. In this example, the fine component is equal to the third time difference 715 ($d_3$) minus the first time difference 709 ($d_1$), the result divided by the second time difference 712 ($d_2$) minus the first time difference 709 ($d_1$), i.e.:

$$\frac{d_3 - d_1}{d_2 - d_1}$$

The value indicative of the capacitance sensed by the capacitive sensor 603 may be equal to the sum of the coarse component and the fine component. It will be appreciated that the fine component of the embodiments described with reference to FIGS. 5 and 6 is, in fact, equal to the fine component described in the embodiments described with reference to FIGS. 1 and 4. The first time difference described with reference to FIGS. 1 and 4 comprises a fractional portion of a last clock period during which the first delay time was less than the third delay time. Comparing FIGS. 3 and 8, it can be seen that $d_3-d_1$ provides the same fractional portion. Correspondingly, the second time difference described with reference to FIGS. 1 and 4 comprises another fractional clock period of the last clock period during which the first delay time was less than the third delay time before the first clock period during which the first delay time was greater than the third delay time. Comparing FIGS. 3 and 8, it can also be seen that $(d_2-d_3)+(d_3-d_1)$ is equal to x+y of the earlier embodiments, i.e., the time difference between receipt of the first output signal during the last clock period in which the first delay time is less than the third delay time and the time of receipt of the first output signal during the first clock period in which the first delay time is greater than the third delay time. It will be appreciated that a plurality of different measurements could be made in order to arrive at the same value according to the present disclosure.

Figure 9A:
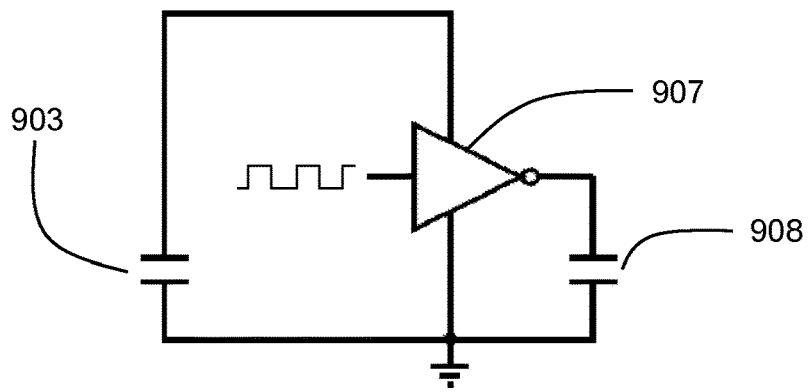

In each of the embodiments described above an example of an inverter block 107, 127, 457 is provided. It will be appreciated, however, that the functionality of the inverter blocks 107, 127, 457 may alternatively be implemented using discrete switches with any of a plurality of different options, some examples of which are shown in FIGS. 9A-9D. The example of FIG. 9A shows the inverter block comprising an inverter component. The input node of the inverter component is connected to the capacitive sensor 903, the clock node of the inverter component is configured to receive the clock signal, the output node of the inverter component connected to the first delay block load capacitor 108 and the ground node is connected to ground.

Figure 9B:
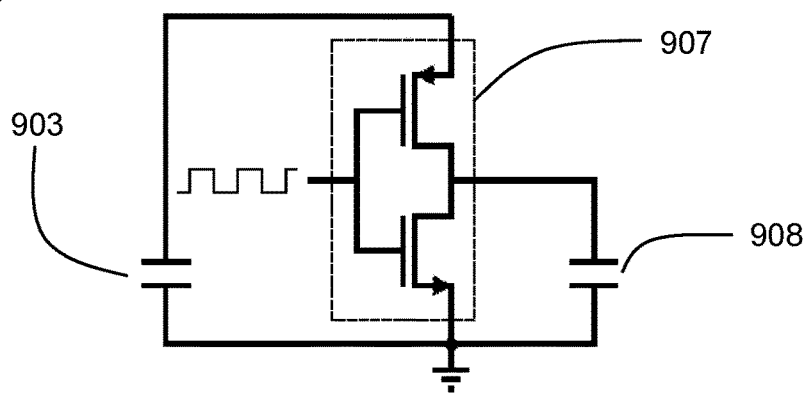
Figure 9C:
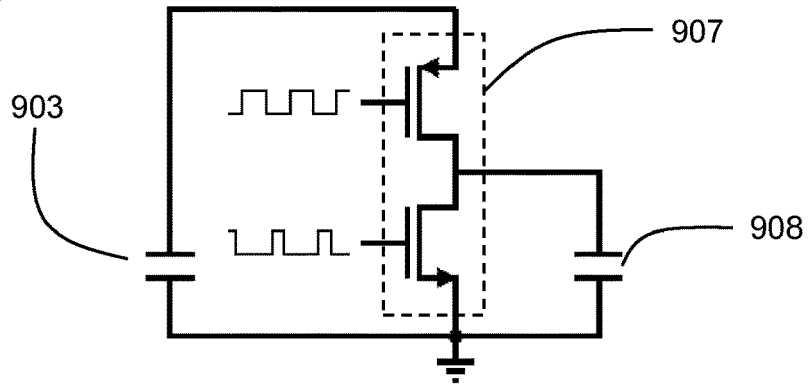

The inverter block 907 may be comprised of one or more PMOS and NMOS transistors, as shown in FIGS. 9B and 9C. The PMOS may be regarded as a resistor, which provides an RC discharge network and the NMOS may be used to clear the charge from a first delay block load capacitor 108. In some embodiments, such as that shown in FIG. 9C, the inverter block 107 may receive two non-overlapping clock signals at a first and second inverter block clock nodes. The first clock signal may be provided to a PMOS at a gate terminal and the second clock signal may be provided to an NMOS at a gate terminal wherein the PMOS and the NMOS are connected in series. In another embodiment, such as that shown in FIG. 9B, both the PMOS and the NMOS may receive the same clock signal at the first and second gate terminals. A source terminal of the PMOS may be connected to the input node 102 of the first delay block 101. The drain terminal of the PMOS may be connected to the drain terminal of the NMOS. The source terminal of the NMOS may be connected to ground. The two non-overlapping clock signals may comprise symmetrical or asymmetrical clock signals. In some embodiments, wherein the inverter block comprises a PMOS and an NMOS, providing for first and second non-overlapping clock signals received at first and second inverter clock nodes may prevent a crow-bar current from flowing should the voltage on the capacitive sensor be larger than the sum of the threshold voltage of the PMOS and NMOS transistors. A crow-bar current may result in non-linearity in the conversion of the capacitance sensed by capacitive sensor 103 into a digital value.

Figure 9D:
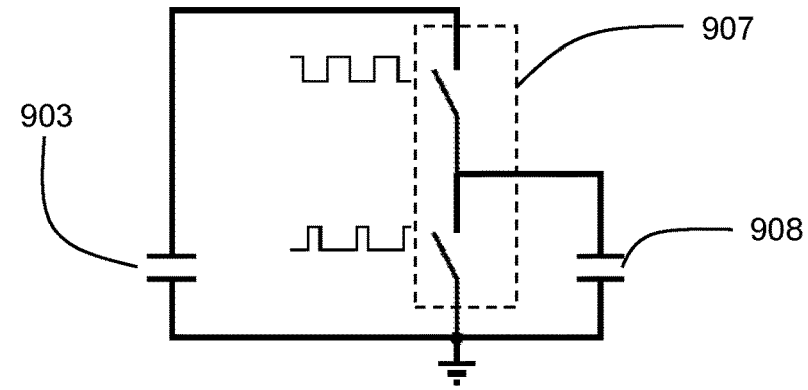

In another embodiment, as shown in FIG. 9D, the inverter block may instead comprise first and second discrete switches controlled by two different clock signals, as in the example of the individually controlled inverter block of FIG. 9C. This arrangement may provide for similar advantages of preventing a crow-bar current from flowing.

In yet another embodiment, a plurality of transmission gates may be used where a first transmission gate is used for the discharging of the capacitive sensor 103 and a second transmission gate is used to clear the charge on the first delay block load capacitor 108, i.e., the first transmission gate may provide the functionality of a PMOS and a second transmission gate may provide the functionality of an NMOS. In such an embodiment, the clock signals used to control the two transmission gates would need to be non-overlapping. As disclosed above, the first and second comparators may comprise delay comparators or time domain comparators. An example embodiment of a delay comparator 1000 is shown in FIG. 10 according to at least one embodiment implemented using logic gates. The delay comparator 1000 is configured to detect at which input node of a first input node 1001 and a second input node 1002 a rising edge signal, for example, is detected before the other input node. First output node 1003 and second output node 1004 are provided in this example, from which an output signal is provided based on which of the input nodes 1001, 1002 received an input signal first. The delay comparator 1000 may be considered as a SR latch. When the input signals at the input nodes of the first and second NAND gates 1005, 1006 are 0, both NAND gates 1005, 1006 are disabled and the logic level at the first NAND gate output 1007 and the second NAND gate output are at logic 1. Due to this, the final outputs at the first and second output nodes 1003, 1004 of the delay comparator 1000 are both 0. When a rising edge is received at the first input node 1001, the input at the first input 1009 of the first NAND gate 1005 is 1. The second input 1011 of the first NAND gate 1005 is 1 due to the feedback provided by the output 1008 of the second NAND gate 1006. At this point, the second input node 1012 of the second NAND gate 1006 is set to 0 due to the feedback from the output node 1007 of the first NAND gate 1005, meaning that the output 1008 of the second NAND gate 1006 will no longer change when a signal is received at the first input 1010 of the second NAND gate 1006. When the second input signal is received at the second input 1002 of the delay comparator 1000, the signal will be sent via a first buffer 1013 to a first AND gate 1015. At this point, since the output 1007 of the first NAND gate 1005 is set to 0, the output of the first inverter 1017, provides an output of 1 to the second input node of the first AND gate 1015. Since both inputs of the first AND gate 1015 are now 1, an output signal 1003 will be provided from the first AND gate 1015 which is indicative that a signal was received at the first input node 1001 of the delay comparator 1000 before a signal was received at the second input node 1002 of the delay comparator 1000. It will be appreciated that the circuit comprises a symmetrical arrangement and, as such, the circuit will function equally and oppositely if a signal is received at the second input node of the delay comparator before the first input node of the delay comparator such that an output signal is provided by the second AND gate. It will be appreciated that, while two output nodes 1003, 1004 are provided from the delay comparator of FIG. 10, these may be combined into a single output signal in any number of ways such that the component receiving the output signal, such as the digital delay block, can determine whether the signal originated from the first output node or the second output node. Alternatively, in some embodiments the delay comparators shown in the embodiments of FIGS. 1, 4, 5 and 6 may each comprise two outputs.

As shown in FIG. 11, a method 1100 may be provided for providing capacitance to digital conversion of a capacitance sensed by a capacitive sensor comprising:

receiving 1101 a voltage at a capacitive sensor;
iteratively discharging 1102 the capacitive sensor through a first delay block based on a clock signal, the clock signal defining a clock period until a subsequent clock signal, the first delay block having an input node configured to receive the voltage from the capacitive sensor and a clock node configured to receive the clock signal, the first delay block configured to output a first output signal based on the voltage at the input node;

providing 1103 a second output signal after a second delay time from a second delay block in response to the clock signal, the second input node configured to receive a first voltage and a clock node configured to receive the clock signal, wherein the second delay time is based on a first voltage; and determining 1104 a value indicative of a capacitance sensed by the capacitive sensor based on:
  the number of clock periods during which the first delay time is greater than a third delay time;
  a first time difference between a time of receipt of the first output signal and the second output signal by the capacitance determination unit during a last clock period during which the first delay time is less than the third delay time; and
  a second time difference between a time of receipt of the first output signal and the second output signal by the capacitance determination unit during a first clock period during which the first delay time is greater than the third delay time, wherein the third delay time comprises a constant delay time after the clock signal and wherein the third delay time is greater than or equal to the second delay time.

The instructions and/or flowchart steps in the above figures can be executed in any order, unless a specific order is explicitly stated. Also, those skilled in the art will recognize that while one example set of instructions/method has been discussed, the material in this specification can be combined in a variety of ways to yield other examples as well, and are to be understood within a context provided by this detailed description.

In some example embodiments the set of instructions/method steps described above are implemented as functional and software instructions embodied as a set of executable instructions which are effected on a computer or machine which is programmed with and controlled by said executable instructions. Such instructions are loaded for execution on a processor (such as one or more CPUs). The term processor includes microprocessors, microcontrollers, processor modules or subsystems (including one or more microprocessors or microcontrollers), or other control or computing devices. A processor can refer to a single component or to plural components.

In other examples, the set of instructions/methods illustrated herein and data and instructions associated therewith are stored in respective storage devices, which are implemented as one or more non-transient machine or computer-readable or computer-usable storage media or mediums. Such computer-readable or computer usable storage medium or media is (are) considered to be part of an article (or article of manufacture). An article or article of manufacture can refer to any manufactured single component or multiple components. The non-transient machine or computer usable media or mediums as defined herein excludes signals, but such media or mediums may be capable of receiving and processing information from signals and/or other transient mediums.

Example embodiments of the material discussed in this specification can be implemented in whole or in part through network, computer, or data based devices and/or services. These may include cloud, internet, intranet, mobile, desktop, processor, look-up table, microcontroller, consumer equipment, infrastructure, or other enabling devices and services. As may be used herein and in the claims, the following non-exclusive definitions are provided.

In one example, one or more instructions or steps discussed herein are automated. The terms automated or automatically (and like variations thereof) mean controlled operation of an apparatus, system, and/or process using computers and/or mechanical/electrical devices without the necessity of human intervention, observation, effort and/or decision.

It will be appreciated that any components said to be coupled may be coupled or connected either directly or indirectly. In the case of indirect coupling, additional components may be located between the two components that are said to be coupled.

In this specification, example embodiments have been presented in terms of a selected set of details. However, a person of ordinary skill in the art would understand that many other example embodiments may be practiced which include a different selected set of these details. It is intended that the following claims cover all possible example embodiments.

The invention claimed is:

1. A capacitance to digital converter comprising:
  a first delay block having an input node configured to receive a voltage from a capacitive sensor and a clock node configured to receive a clock signal defining a clock period until a subsequent clock signal, the first delay block configured to output a first output signal after a first delay time in response to receiving the clock signal each clock period, the first delay time based on the voltage at the input node, and wherein the first delay block is configured to provide for iterative discharging of the capacitive sensor based on the clock signal;
  a second delay block having an input node configured to receive a first voltage and a clock node configured to receive the clock signal, the second delay block configured to output a second output signal after a second delay time in response to the clock signal, the second delay time based on the first voltage; and
  a capacitance determination unit configured to determine a value indicative of a capacitance sensed by the capacitive sensor based on:
    the number of clock periods during which the first delay time is less than a third delay time;
    a first time difference between a time of receipt of the first output signal and a time of receipt of the second output signal by the capacitance determination unit during a last clock period during which the first delay time is less than the third delay time; and
    a second time difference between a time of receipt of the first output signal and
    a time of receipt of the second output signal by the capacitance determination unit during a first clock period during which the first delay time is greater than the third delay time,
  wherein the third delay time comprises a constant delay time after the clock signal and
  wherein the third delay time is greater than or equal to the second delay time.

2. The capacitance to digital converter of claim 1 wherein the capacitance determination unit comprises:
  a control unit, the control unit comprising a counter module configured to count the number of clock periods during which the first delay time is less than the third delay time; and
  a fine measurement unit, the fine measurement unit configured to receive the first and second output signals and the fine measurement unit comprising a time-to-digital converter, wherein the time-to-digital converter is configured to at least measure the first time difference and the second time difference.

3. The capacitance-to-digital converter of claim 2 wherein the control unit further comprises a first comparator and a digital control block comprising an edge generator, the first comparator configured to provide an output signal to the digital control block which is configured to cause the edge generator to generate or stop generating the clock signal based on the output signal of the first comparator.

4. The capacitance-to-digital converter of claim 3 wherein the first comparator is further configured to provide an output signal to the digital control block which provides a control signal to the edge generator which causes the edge generator to stop the generation of clock signals during a first clock period during which the second output signal was received by the first comparator prior to the first output signal.

5. The time-to-digital converter of claim 1 wherein the value indicative of a capacitance sensed by the capacitive sensor is based on:
the number of clock periods during which the first delay time is less than the third delay time; and
the first time difference divided by the sum of the first time difference and the second time difference.

6. The capacitance to digital converter of claim 2 comprising a trigger delay block configured to provide for activation, from a deactivated state, of the time-to-digital converter to allow for determination of the difference between the time of receipt of the first output signal and the time of receipt of the second output signal:
a) after at least one clock period; and
b) before the last clock period during which the first time delay is greater than the third time delay.

7. The capacitance-to-digital converter of claim 6 wherein the trigger delay block comprises a third delay block having an input node configured to receive a second voltage higher than the first voltage and a clock node configured to receive the clock signal, the trigger delay block configured to output a third output signal after a fourth delay time in response to the clock signal, the fourth delay time based on the second voltage.

8. The capacitance-to-digital converter of claim 6 wherein the trigger delay block comprises the second delay block and wherein the capacitance determination unit is configured to receive a fourth output signal after the third delay time based on a third voltage, wherein the third delay time is longer than the second delay time and wherein the capacitance-to-digital convertor is configured to operate in:
a calibration mode, in which the time-to-digital converter is configured to determine a third time difference wherein the third time difference is the difference between a time of receipt of the fourth output signal and a time of receipt of the second output signal; and
a measurement mode for iterative discharging of the capacitive sensor in which the determination of the value indicative of the capacitance of the capacitive sensor is further based on the third time difference.

9. The capacitance-to-digital converter of claim 8 wherein the trigger delay block comprises the second delay block and the capacitance-to-digital converter further comprises a fourth delay block having an input node configured to receive the third voltage and a clock node configured to receive the clock signal, the fourth delay block configured to output the fourth output signal after the third delay time in response to the clock signal.

10. The capacitance-to-digital converter of claim 9 wherein the first comparator is further configured to provide an output to the digital control block which provides a control signal to the edge generator which causes the edge generator to stop the generation of clock signals during a first clock period during which the fourth output signal was received by the first comparator prior to the first output signal.

11. The capacitance-to-digital converter of claim 8 wherein a first input node of the time-to-digital converter is switchably configured to receive either the fourth output signal of the fourth delay block or the first output signal of the first delay block and a second input node of the time-to-digital converter is configured to receive the second output signal of the second delay block and wherein selection of which of the first or fourth delay block is connected to the first input node of the time-to-digital converter is based on the difference between the time of receipt of the second output signal and the time of receipt of the first output signal by the second comparator.

12. The capacitance to digital converter of claim 8 wherein the input node of the first delay block is switchably connected between the capacitive sensor and a reference voltage node, the reference voltage node configured to, when connected to the first delay block in the calibration mode, provide the third voltage to the first delay block such that the first delay block is configured to output the fourth output signal after the third delay time after receipt of the clock signal and wherein, in the measurement mode, the input node of the first delay block is connected to the capacitive sensor.

13. The capacitance-to-digital converter of claim 11 wherein the control signal of the digital control block is based on the time of receipt of the first output signal by the first comparator, the time of receipt of the second output signal by the first comparator and the third time difference.

14. The capacitance-to-digital converter of claim 6 wherein the value indicative of the capacitance sensed by the capacitive sensor is the sum of:
the number of clock periods during which the first delay time was less than the third delay time; and
the third time difference minus the first time difference, the result divided by the second time difference minus the first time difference.

15. A method of providing capacitance to digital conversion of a capacitance sensed by a capacitive sensor comprising:
receiving a voltage at a capacitive sensor;
iteratively discharging the capacitive sensor through a first delay block based on a clock signal, the clock signal defining a clock period until a subsequent clock signal, the first delay block having an input node configured to receive the voltage from the capacitive sensor and a clock node configured to receive the clock signal, the first delay block configured to output a first output signal based on the voltage at the input node;
providing a second output signal after a second delay time from a second delay block in response to the clock signal, the second input node configured to receive a first voltage and a clock node configured to receive the clock signal, wherein the second delay time is based on a first voltage; and
determining a value indicative of a capacitance sensed by the capacitive sensor based on:
the number of clock periods during which the first delay time is greater than a third delay time;
a first time difference between a time of receipt of the first output signal and the second output signal by the capacitance determination unit during a last clock period during which the first delay time is less than the third delay time; and a second time difference between a time of receipt of the first output signal and the second output signal by the capacitance determination unit during a first clock period during which the first delay time is greater than the third delay time, wherein the third delay time comprises a constant delay time after the clock signal and wherein the third delay time is greater than or equal to the second delay time.

* * * * *